United States Patent
Forney

(10) Patent No.: US 9,871,511 B2
(45) Date of Patent: Jan. 16, 2018

(54) PROTECTION SWITCHING FOR MATRIX OF FERRITE MODULES WITH REDUNDANT CONTROL

(71) Applicant: Honeywell International Inc., Morristown, NJ (US)

(72) Inventor: Sean Forney, Suwanee, GA (US)

(73) Assignee: Honeywell International Inc., Morris Plains, NJ (US)

( * ) Notice: Subject to any disclaimer, the term of this patent is extended or adjusted under 35 U.S.C. 154(b) by 815 days.

(21) Appl. No.: 14/321,229

(22) Filed: Jul. 1, 2014

(65) Prior Publication Data

US 2016/0006431 A1 Jan. 7, 2016

(51) Int. Cl.
| | |
|---|---|
| H03K 17/81 | (2006.01) |
| H03K 17/687 | (2006.01) |
| H03K 17/00 | (2006.01) |
| H03K 17/80 | (2006.01) |

(52) U.S. Cl.
CPC ......... *H03K 17/687* (2013.01); *H03K 17/002* (2013.01); *H03K 17/80* (2013.01); *H03K 17/81* (2013.01)

(58) Field of Classification Search
CPC .............................. H03K 17/81; H03K 17/80
See application file for complete search history.

(56) References Cited

U.S. PATENT DOCUMENTS

| | | | | |
|---|---|---|---|---|
| 2,902,677 | A | * 9/1959 | Counihan | ......... G11C 11/06035 307/412 |
| 3,305,838 | A | * 2/1967 | Atwood | ................ H03K 17/81 307/415 |
| 3,585,615 | A | 6/1971 | Takahashi | |
| 3,710,280 | A | 1/1973 | Buck | |

(Continued)

FOREIGN PATENT DOCUMENTS

WO    03041213    5/2003

OTHER PUBLICATIONS

U.S. Patent and Trademark Office, "Office Action", "from U.S. Appl. No. 14/068,515", dated Mar. 28, 2016, pp. 1-24, Published in: US.

(Continued)

*Primary Examiner* — Thienvu Tran
*Assistant Examiner* — Pinping Sun
(74) *Attorney, Agent, or Firm* — Fogg & Powers LLC

(57) ABSTRACT

A protection switching circuit includes a plurality of ferrite modules arranged in a matrix, wherein the matrix includes a plurality of columns and a plurality of rows. The protection switching circuit further includes a primary control module configured to select a specific ferrite module to be polarized and a redundant control module configured to select a specific ferrite module to be polarized, wherein the redundant control module is used when the primary control module is not used. The protection switching circuit further includes a plurality of first switches, wherein the plurality of first switches couples the plurality of columns of the matrix (Continued)

to a first and second charging circuit. The protection switching circuit further includes a plurality of second switches, wherein the plurality of second switches are organized into pairs, wherein each pair in the plurality of second switches couples a respective row of the matrix to a reference potential.

12 Claims, 4 Drawing Sheets

(56) References Cited

U.S. PATENT DOCUMENTS

| | | | |
|---|---|---|---|
| 3,751,825 | A | 8/1973 | Barrett |
| 4,355,210 | A | 10/1982 | Soulliard |
| 4,401,861 | A | 8/1983 | Braun et al. |
| 4,490,700 | A | 12/1984 | Stern et al. |
| 4,618,831 | A | 10/1986 | Egami et al. |
| 4,772,886 | A | 9/1988 | Hasegawa |
| 5,160,934 | A | 11/1992 | Alpers et al. |
| 5,568,088 | A | 10/1996 | Dent et al. |
| 5,610,556 | A | 3/1997 | Rubin |
| 5,872,481 | A | 2/1999 | Sevic et al. |
| 6,591,816 | B2 | 7/2003 | McCoy et al. |
| 6,774,600 | B2 | 8/2004 | Weinbrenner |
| 6,898,428 | B2 | 5/2005 | Thorburn et al. |
| 8,304,671 | B2 | 11/2012 | Fukushima et al. |
| 9,166,267 | B2 | 10/2015 | Kroening et al. |
| 9,601,064 | B1 * | 3/2017 | Amarilio ............ G09G 3/36 |
| 2001/0021558 | A1 | 9/2001 | Sato et al. |
| 2010/0091688 | A1 | 4/2010 | Staszewski et al. |
| 2011/0128762 | A1 | 6/2011 | Ripley et al. |
| 2013/0331026 | A1 | 12/2013 | O'Neill et al. |
| 2014/0225666 | A1 | 8/2014 | Kusu et al. |
| 2015/0115737 | A1 | 4/2015 | Forney |

OTHER PUBLICATIONS

United States Patent and Trademark Office, "Final Office Action", "from U.S. Appl. No. 14/068,515", dated Nov. 18, 2016, pp. 1-22, Published in: US.

United States Patent and Trademark Office, "Advisory Action", "from U.S. Appl. No. 14/068,515", dated Feb. 28, 2017, pp. 1-3, Published in: US.

European Patent Office, "Extended European Search Report from EP Application No. 14187683.9 dated Mar. 17, 2015", "from Foreign Counterpart of U.S. Appl. No. 14/068,515", dated Mar. 17, 2015, pp. 1-4, Published in: EP.

European Patent Office, "Extended European Search Report from EP Application No. 15171073.8 dated Nov. 17, 2015", "from Foreign Counterpart of U.S. Appl. No. 14/321,229", dated Nov. 17, 2015, pp. 1-10, Published in: EP.

Forney, "Matrix Ferrite Driver Circuit", "U.S. Appl. No. 14/068,515, filed Oct. 31, 2013", Oct. 31, 2013, pp. 1-26, Published in: US.

United States Patent and Trademark Office, "Notice of Allowance", "From U.S. Appl. No. 14/068,515", filed Sep. 7, 2017, pp. 113, Published in: US.

* cited by examiner

PROTECTION SWITCHING FOR MATRIX OF FERRITE MODULES WITH REDUNDANT CONTROL

CROSS-REFERENCE TO RELATED APPLICATIONS

This application is related to the following co-pending United States patent applications, all of which are hereby incorporated herein by reference:

U.S. patent application Ser. No. 14/068,515 entitled "MATRIX FERRITE DRIVER CIRCUIT" filed on Oct. 31, 2013, and which is referred to herein as the '515 application.

BACKGROUND

Some communication nodes in a communications network are not easily accessible for repairs if there is a failure in the node. For example, some communication nodes are located in space. Switch networks are used in communication nodes to redirect communications in the event of a failure of a component. This is often referred to as "protection switching." Ferrite switches are used in some communications nodes for protection switching to provide redundancy for the communication pathway. Ferrite switches provide many benefits over electro-mechanical switches and are used in space and other applications where accessibility for repair is limited.

SUMMARY

The embodiments of the present invention provide methods and systems for a protection switching circuit and will be understood by reading and studying the following specification.

A protection switching circuit includes a plurality of ferrite modules arranged in a matrix, wherein the matrix includes a plurality of columns and a plurality of rows. The protection switching circuit further includes a primary control module configured to select a specific ferrite module to be polarized and a redundant control module configured to select a specific ferrite module to be polarized, wherein the redundant control module is used when the primary control module is not used. The protection switching circuit further includes a plurality of first switches, wherein the plurality of first switches couples the plurality of columns of the matrix to a first and second charging circuit. The protection switching circuit further includes a plurality of second switches, wherein the plurality of second switches are organized into pairs, wherein each pair in the plurality of second switches couples a respective row of the matrix to a reference potential.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the specification is not to be construed as limiting the order in which the individual steps may be performed. The following detailed description is, therefore, not to be taken in a limiting sense.

The switch networks of ferrite switches for communication nodes discussed above can be arranged in the form of a matrix. To use this matrix for protection switching, the polarity of the ferrite switches is controlled by a control circuit or module. While these control circuits do not alter the polarity of the ferrite switches on a frequent basis, their electronics or components are still prone to failure and can hinder the protection switching ability of the communications node if a component in the control circuit fails. The embodiments described in this disclosure provide for redundancy in the control circuits of the switch networks. By including this redundancy, the failure of a single component in the control circuit will not disable the entire network of ferrite switches. This increases the lifespan of the communication nodes that are not easily accessible for repairs.

Figure 1:
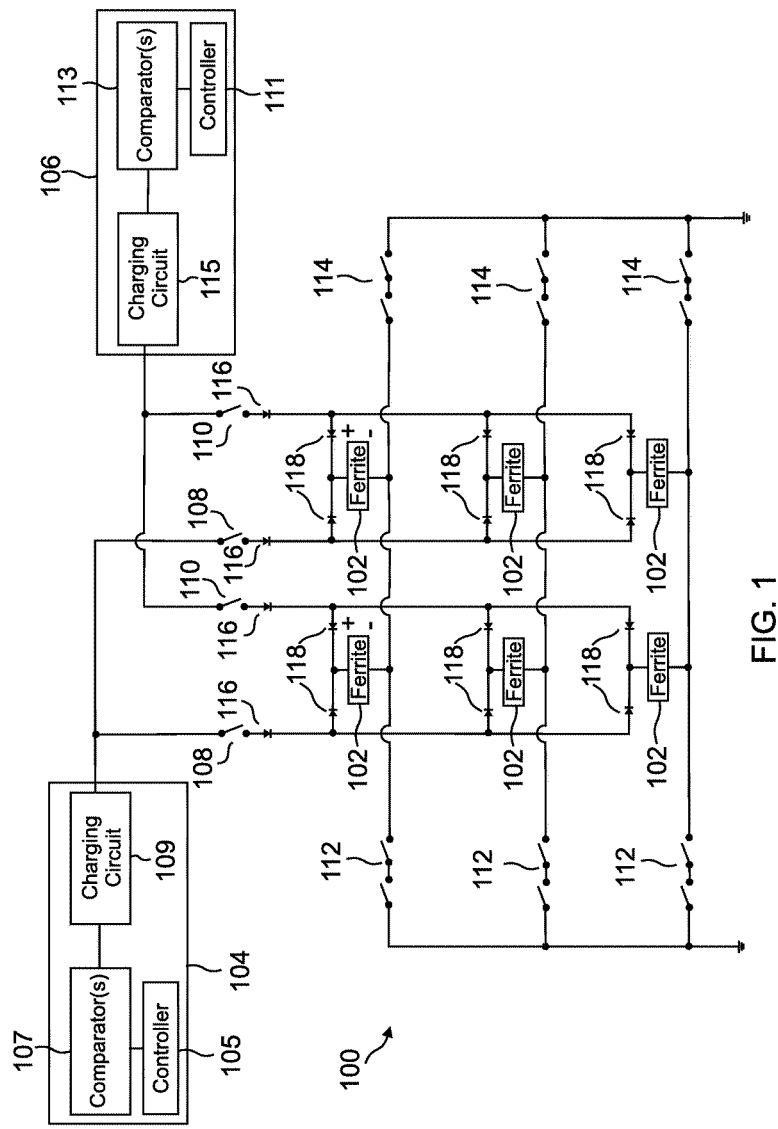
FIG. 1 is a block diagram of an example of a protection switching circuit using a matrix of ferrite modules with redundant control circuits.

FIG. 1 is a block diagram of an example protection switching circuit 100. The protection switching circuit 100 includes a plurality of ferrite modules 102 arranged in a matrix, a primary control module 104, a redundant control module 106, a plurality of first switches 108, 110, and a plurality of second switches 112, 114.

The protection switching circuit 100 is used to adjust and control the polarization of the ferrite modules 102. The ferrite modules 102 can be any type of ferrite switch and are arranged in a matrix having a plurality of columns and rows. While a 2×3 matrix is shown in FIG. 1, it is to be understood that this is for illustration and circuit 100 can include any size matrix of ferrite modules 102. In an example, the number of ferrite modules 102 is selected based on the number of inputs and outputs of the system. In an example, the ferrite modules 102 are ferrite circulators, which connect to one another to provide switching capabilities between a number of module inputs and outputs. The ferrite circulators may be waveguide circulators, where each circulator has three arms at 120° that meet in a common junction and the common junction of the three arms is loaded with ferrite. When a magnetizing field is created in the ferrite that is located at the common junction, a gyromagnetic can be used to switch the microwave signal from one waveguide arm to another. By reversing the direction of the magnetizing field, the direction of switching between the waveguide is reversed.

The ferrite modules 102 are coupled to the primary control module 104 and the redundant control module 106 through the plurality of first switches 108, 110. Specifically, the first switches 108, 110 couple a respective column of the ferrite modules to a reference potential in either the primary control module 104 or the redundant control module 106.

The ferrite modules 102 are also coupled to a reference potential through the plurality of second switches 112, 114. Specifically, the second switches 112, 114 couple a respective row of the ferrite modules to a reference potential.

The connections to the ferrite modules 102 are through latch wires looped through the ferrite modules 102. In an example, the ferrite modules 102 have a single latch wire. When the ferrite modules 102 have a single latch wire, there is only one possible polarization. The protection switching circuit 100 is used to reaffirm the polarization of the ferrite modules 102 if the ferrite modules 102 loses its polarity. In another example, the ferrite modules 102 have two latch wires, each electrically isolated from one another and corresponding to an opposite polarity. When the ferrite modules 102 have two latch wires, each single ferrite module 102 is depicted twice in circuit 100, for each of the two latch wire connections. The protection switching circuit 100 is used to switch the polarization of the ferrite modules 102 between the two possible polarities.

In an example, the columns of the matrix of ferrite modules 102 are organized into pairs. For example, in FIG. 1, the two columns would be a pair. The ferrite module 102 in a single row for the pair of columns would be the same. However, the connections at those points in the matrix would be made by the different latch wires in the same ferrite module 102. If current is sent to the latch wire of the first column (i.e. row 1, column 1), it results in a first polarity. If current is sent to the latch wire of the second column (i.e. row 1, column 2), it results in a second polarity that is opposite of the first polarity.

In another example, the rows of the matrix of ferrite modules 102 are organized into pairs. For example, in FIG. 1, the first two rows would be a pair. The ferrite module 102 in a single column for the pair of rows would be the same. However, the connections at those points in the matrix would be made by the different latch wires in the same ferrite module 102. If current is sent to the latch wire of the first row (i.e. row 1, column 1), it results in a first polarity. If current is sent to the latch wire of the second row (i.e. row 2, column 1), it results in a second polarity that is opposite of the first polarity.

The primary control module 104 is used to polarize a single ferrite module 102 at a time. In an example, the primary control module 104 includes a controller 105, at least one comparator 107, and a charging circuit 109. The primary control module 104 is coupled to the ferrite modules 102 through a first subset of first switches 108. Specifically, the charging circuit 109 of the primary control module 104 is coupled to the ferrite modules 102. In an example, the first subset of first switches 108 can be P-channel field effect transistors (FETs) or PNP transistors.

The controller 105 of the primary control module 104 drives the first subset of first switches 108 and a first subset of second switches 112. The controller 105 can include a microcontroller, microprocessor, field programmable gate array (FPGA), application specific integrated circuit (ASIC), a central processing unit (CPU) coupled to a memory device, or other programmable devices.

The at least one comparator 107 of the primary control module 104 controls the specific voltage that will be delivered from the charging circuit 109 to the selected ferrite module 102. The at least one comparator 107 is coupled to both the controller 105 and the charging circuit 109 of the primary control module 104. To allow for the plurality of ferrite modules 102 to be switched to the same peak current, multiple comparators 107 may be used in the circuit 100. The use of multiple comparators 107 accounts for latch wires for different ferrite modules 102 having different impedances. For example, the latch wires in different ferrite modules 102 could be different lengths.

The charging circuit 109 of the primary control module 104 provides current to polarize the plurality of ferrite modules 102. In an example, the charging circuit 109 can include a power source, a switch, a set of resistors, and a capacitor. The power source is coupled to the set of resistors and the capacitor through the switch. The switch is controlled by the controller 105 of the primary control module 104.

The ferrite modules 102 are coupled to a first reference potential through the first subset of second switches 112. In an example, the first reference potential is ground. In an example, the first subset of second switches 112 can be N-channel FETs or NPN transistors. The first subset of second switches 112 includes pairs of switches that are controlled by the primary control module 104. This design prevents a permanent connection to ground if one of the second switches fails short. This configuration also prevents the failure of a single switch in the primary control circuit from interfering with the operation of the redundant control circuit.

The protection switching circuit 100 also includes a redundant control module 106. The redundant control module 106 is used if there is a failure in the primary control circuit or if the primary control module 104 is not used. A failure of the primary control circuit includes a failure of the primary control module 104, any of the switches 108, 112 controlled by the primary control module 104, or any of the diodes 116 in the primary path to the ferrite modules 102. The redundant control module 106 is powered off while the primary control module 104 is used and vice versa. In an example, the redundant control module 106 includes a controller 111, at least one comparator 113, and a charging circuit 115, such as described below with respect to FIG. 3. These components can have the same characteristics as the components in the primary control module 104.

The redundant control module 106 is coupled to the ferrite modules 102 through a second subset of first switches 110. Specifically, the charging circuit 115 of the redundant control module 106 is coupled to the ferrite modules 102. In an example, the second subset of first switches 110 can be P-channel FETs or PNP transistors. The second subset of first switches 110 is controlled by the controller 111 of the redundant control module 106.

The ferrite modules 102 are also coupled to a second reference potential through a second subset of second switches 114. In an example, the second reference potential is ground. In an example, the second subset of second switches 114 can be N-channel FETs or NPN transistors. The second subset of second switches 114 are organized into pairs and controlled by the redundant control module 106. This design prevents a permanent connection to ground if one of the switches fails short. This configuration also prevents the failure of a single switch in the redundant control circuit from interfering with the operation of the primary control circuit.

In an example, the protection switching circuit 100 also includes a plurality of diodes 116, 118 coupled between the ferrite modules 102 and the plurality of first switches 108, 110. The plurality of diodes 116 on the vertical connection can be included in the circuit 100 to prevent pass back current from interfering with either the primary control module 104 or the redundant control module 106. As a result, only a single switch 108, 110 is needed to connect the columns of the ferrite modules 102 because the diodes 116 on the vertical connection prevent the failure of a single switch from interfering with the operation of the primary control module 104 and the redundant control module 106. This function is similar to that of the switch pairs 112, 114 discussed above. The plurality of diodes 118 on the horizontal connection ensures that current passes through only the selected ferrite module 102 for a single row and column.

The protection switching circuit 100 polarizes a single, selected ferrite module of the plurality of ferrite modules 102 at a time. In a first operating mode, the controller 105 of the primary control module 104 drives the switch of the primary control module 104 closed in order to couple the power source to the set of resistors and the capacitor. The capacitor is charged to a specified charging voltage, which is determined by the one of the one or more comparators 107. The comparator 107 sends a signal to the controller 105 when the capacitor has reached the appropriate level of charge, and the controller 105 then drives the switch in the primary control module 104 open.

The controller 105 of the primary control module 104 must then drive particular switches closed that correspond to the column and row of the selected ferrite module. The controller 105 of the primary control module 104 drives a pair of switches of first the subset of second switches 112 that correspond to the selected ferrite module in order to couple the selected ferrite module to a reference potential. The controller 105 of the primary control module 104 then drives a switch of the first subset of first switches 108 that corresponds to the selected ferrite module. When the switches that correspond to the column and row of the selected ferrite module are closed, the capacitor of the charging circuit 109 in the primary control module 104 discharges and delivers current to the selected ferrite module.

If there is a failure in the primary control module 104, the switches 108, 112 controlled by the primary control module 104, or any of the diodes 116, 118 in the primary path, then the protection switching circuit 100 switches over to a second operating mode to use the redundant control module 106. The redundant control module 106 operates in the same way as the primary control module 104, except different switches 110, 114 are used for the connections and current flows through a different set of diodes 116, 118. The controller 111 of the redundant control module 106 controls the second subset of first switches 110 and the second subset of second switches 114. The second subset of second switches 114 are organized into pairs, similar to the first subset of second switches 112 that are controlled by the controller in the primary control module 104.

By including this redundancy in the control module, the failure of a single component is prevented from disabling the protection switching function of the entire matrix of ferrite modules 102. The redundant control module 106 and corresponding circuitry is particularly useful in systems that are difficult or impossible to repair because the lifespan of the system would be increased. For example, the protection switching circuit 100 could be used in a satellite in space.

Figure 2:
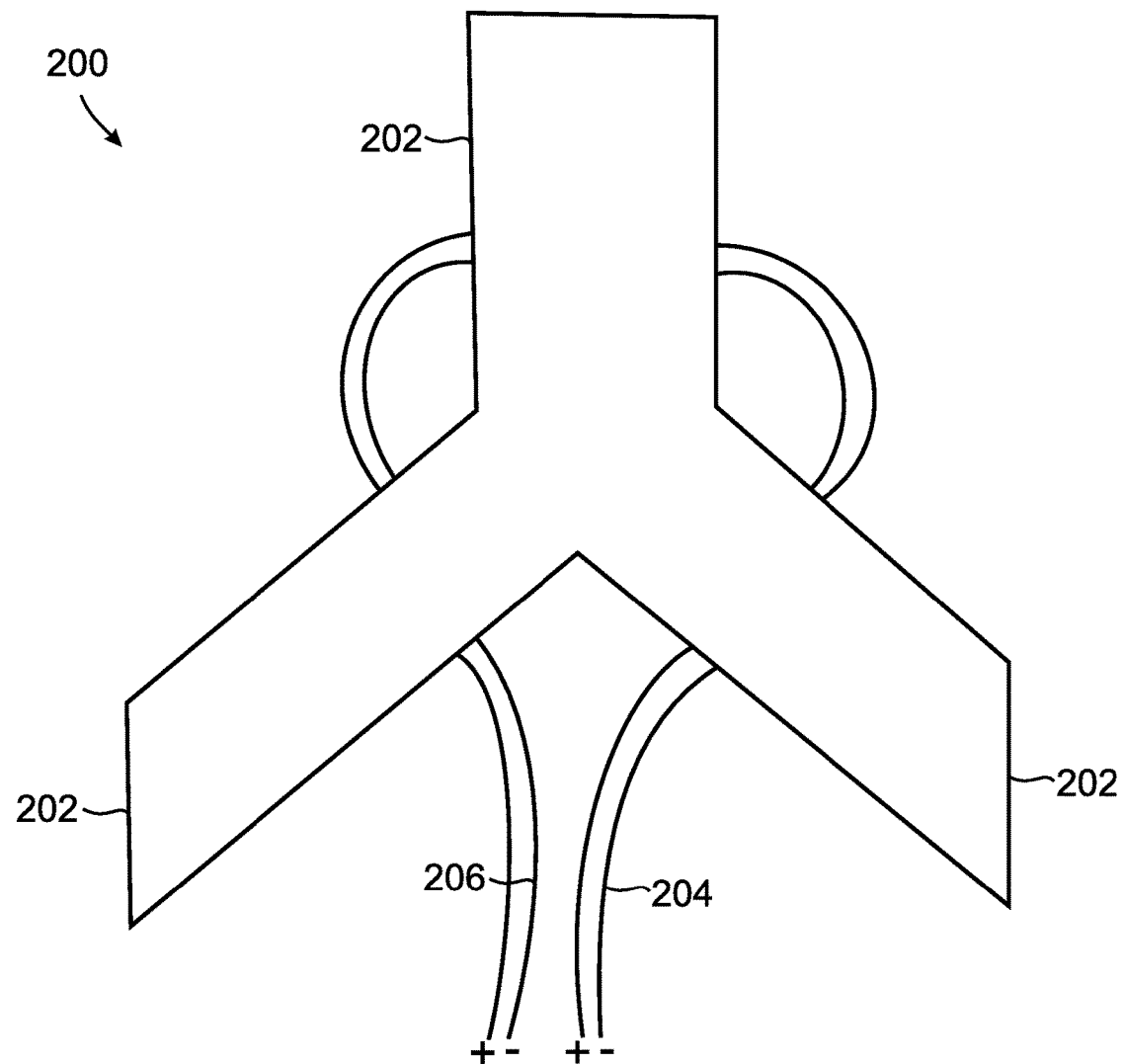
FIG. 2 is a schematic diagram of an example ferrite module.

FIG. 2 is a schematic view of an example ferrite module 200. The ferrite module 200 has three arms 202. The ferrite module 200 has holes drilled into the sides of the arms 202 and two latch wires 204, 206 are looped through the holes. The first latch wire 204 is wired for the opposite polarity as the second latch wire 206. The latch wires 204, 206 are insulated to prevent establishing an electrical connection with each other. The latch wires 204, 206 are the connection points for the ferrite module 200 in the protection switching circuit 100. As an example, the first latch wire 204 is connected at row 1, column 1 of the matrix, and the second latch wire 206 is connected at row 1, column 2. This configuration allows a ferrite module 200 to be polarized in both directions by a single control module (either primary control module 104 or redundant control module 106). This design provides a benefit over prior systems because it reduces the amount of components needed for the protection switching circuit.

Figure 3:
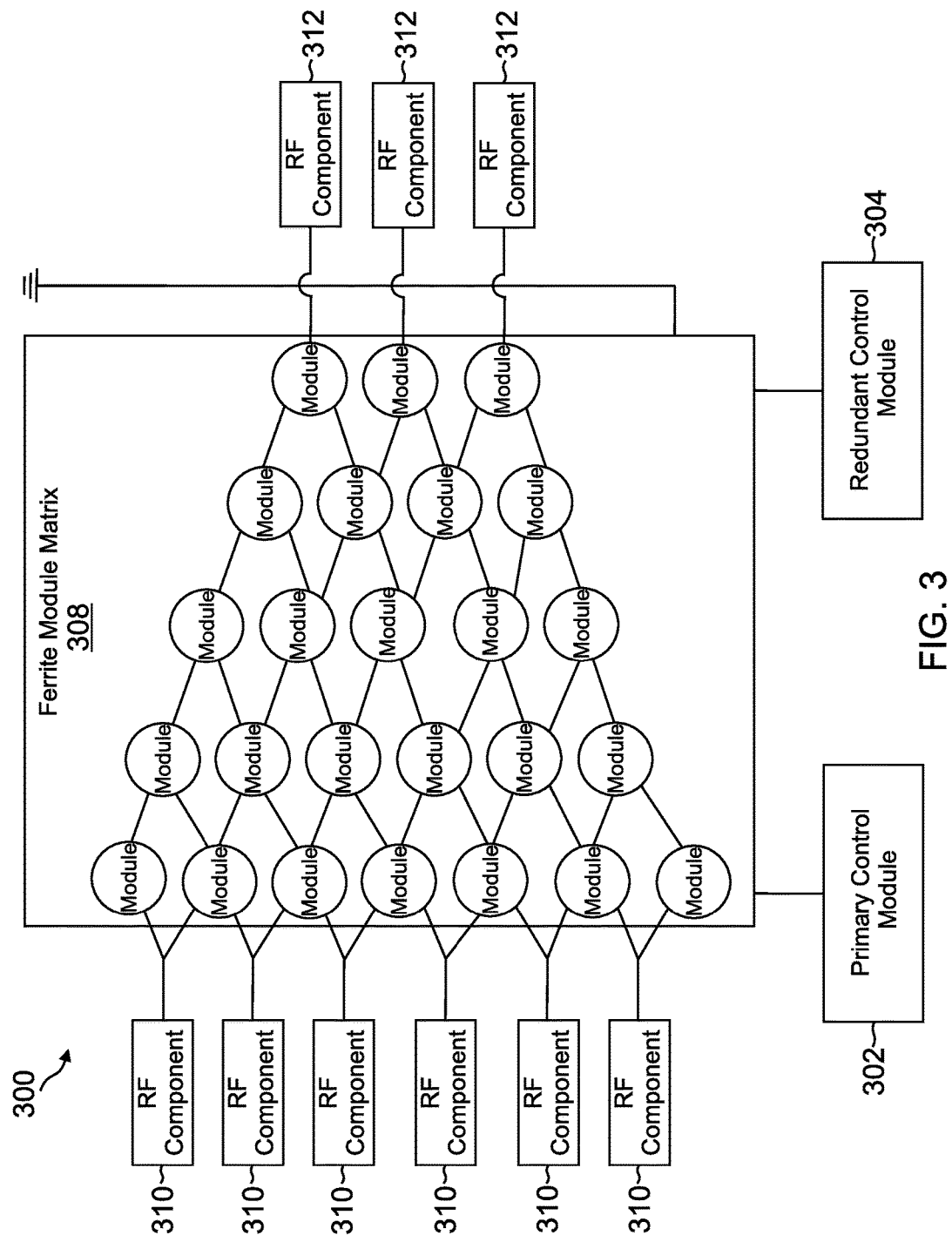
FIG. 3 is a block diagram of an example communications system.

FIG. 3 is a block diagram of an example communications system that implements protection switching using a matrix of ferrite modules that are controlled by redundant control modules. System 300 can be implemented as any radio frequency (RF) system that incorporates redundancy schemes, such as, but not limited to, satellite communications systems. System 300 includes one or more first RF components 310, a protection switching circuit (such as circuit 100), and one or more second RF components 312. The amount of first RF components 310 and second RF components 312 is limited in FIG. 3 for the purposes of illustration. However, it is to be understood that any number of first RF components 310 and second RF components 312 may be used in other embodiments. In an example, the first RF components 310 can be any redundant scheme of RF components, such as a redundant scheme of amplifiers. In an example, the second RF components 312 can be a transmitter, receiver, antenna, or other similar device known to one of skill in the art. For purposes of illustration, the connections of the ferrite module matrix 308 to the first switches, second switches, and the diodes are not shown in FIG. 3, but are still present.

The protection switching circuit incorporated into system 300 includes a primary control module 302, a redundant control module 304, a ferrite module matrix 308 configured to couple the first RF components 310 to the second RF components 312, a plurality of first switches, and a plurality of second switches. The primary control module 302 has similar components to primary control module 104, discussed above with reference to FIG. 1. The redundant control module 304 has similar components to redundant control module 106, discussed above with reference to FIG. 1. The operation of the primary control module 302 and the redundant control module 304 is the same as that of primary control module 104 and redundant control module 106, discussed above with respect to FIG. 1. In an example, system 300 operates by receiving a signal at the second RF components 312. The signal is routed through the ferrite module matrix 308 to one of the first RF components 310.

Figure 4:
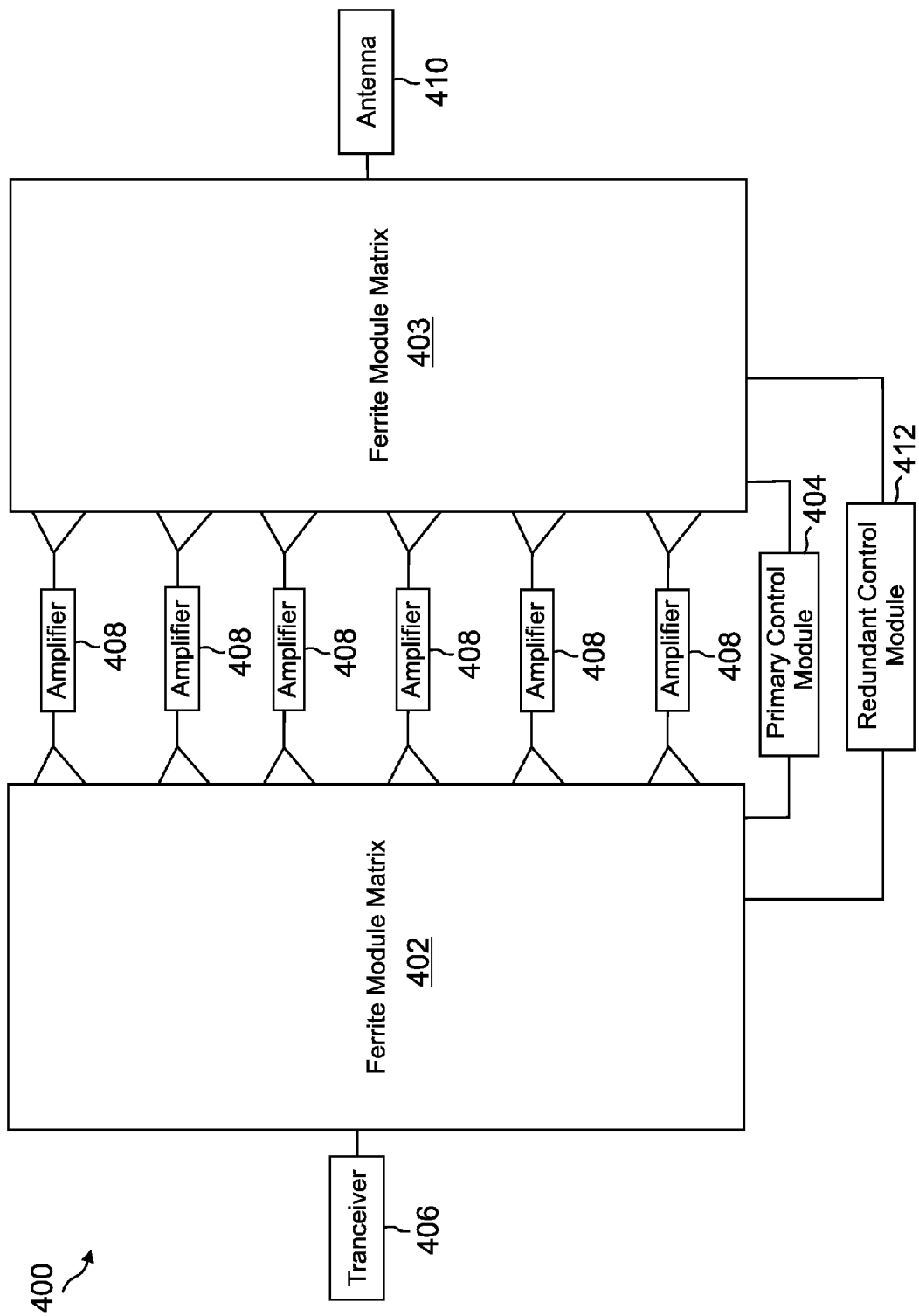
FIG. 4 is a block diagram of another example communications system.

FIG. 4 is a block diagram of an example communications system 400 that utilizes a pair of ferrite module matrices. Communications system 400 is a variation of communications system 300, discussed above with respect to FIG. 3. The system 400 includes two ferrite module matrices 402, 403, a transceiver 406, a plurality of amplifiers 408, and an antenna 410. The ferrite module matrices 402, 403 have similar components and operate in a similar way to the protection switching circuit 100, discussed above with respect to FIG. 1. The ferrite module matrices 402, 403 have common controllers, instead of a separate controller for each individual matrix. The ferrite module matrices 402, 403 share the primary control module 404 and the redundant control module 412. If there is a failure in the primary control circuit in either of the ferrite module matrices 402, 403, the system 400 will power down the primary control module 404 and turn on the redundant control module 412. In an example, the system 400 operates by processing a signal at the antenna 410 and routing it through the first ferrite module matrix 403 to the amplifiers 408. The signal is amplified by the amplifiers 408 and routed through the second ferrite module matrix 402 to the antenna 410 for radiation to another communication node in the communications network.

In an example, the systems 300, 400 discussed above are implemented on a platform that is inaccessible for repairs when a component or the electronics of the system fail. For example, the systems 300, 400 could be implemented on a satellite in space. If the systems 300, 400 experience a failure of the primary control module 302, this will not disable the system. As discussed above, once a failure in the primary control circuit occurs, the systems 300, 400 will shut down the primary control module and power on the redundant control module. A failure of the primary control circuit includes a failure of the primary control module 302, the switches controlled by the primary control module 302, or the diodes in the primary path to the ferrite modules in the ferrite module matrices 402, 403. By including redundancy in the control module, the failure of a single component will not interfere with the protection switching function of the systems 300, 400.

Example Embodiments

Example 1 includes a protection switching circuit comprising: a plurality of ferrite modules arranged in the form of a matrix, wherein the matrix includes a plurality of columns and a plurality of rows; a primary control module configured to select a specific ferrite module to be polarized by coupling the ferrite module to a first charging circuit; a redundant control module configured to select a specific ferrite module to be polarized by coupling the ferrite module to a second charging circuit, wherein the redundant control module is used when the primary control module is not used; a plurality of first switches, wherein a first subset of the plurality of first switches is controlled by the primary control module and couples the plurality of columns of ferrite modules to the first charging circuit, wherein a second subset of the first plurality of switches is controlled by the redundant control module and couples the plurality of columns of ferrite modules to the second charging circuit; and a plurality of second switches, wherein the plurality of second switches are organized into pairs, wherein each pair of switches in the plurality of second switches couples a respective row of the plurality of ferrite modules to a reference potential, wherein a first subset of the plurality of second switches is controlled by the primary control module, wherein a second subset of the plurality of second switches is controlled by the redundant control module.

Example 2 includes the circuit of Example 1, further comprising a plurality of diodes coupled between the plurality of ferrite modules and the plurality of first switches.

Example 3 includes the circuit of any of Examples 1-2, wherein connections to the ferrite modules are made through latch wires.

Example 4 includes the circuit of Example 3, wherein the plurality of columns is organized into pairs, wherein the latch wires connected in each row of the pair of columns correspond to an opposite polarity of the same ferrite module.

Example 5 includes the circuit of any of Examples 3-4, wherein the plurality of rows is organized into pairs, wherein the latch wires connected in each column of the pair of rows correspond to an opposite polarity of the same ferrite module.

Example 6 includes the circuit of any of Examples 1-5, wherein the reference potential is ground.

Example 7 includes a method for driving a plurality of ferrite modules arranged in the form of a matrix, the method comprising: when operating in a first mode: selecting a ferrite module to establish the state of; coupling a selected row of a plurality of rows of a ferrite module matrix to a reference potential via a first plurality of switch pairs, wherein the first plurality of switch pairs is part of a primary control circuit; coupling a selected column of a plurality of columns of the ferrite module matrix to a first charging circuit via a first plurality of switches, wherein the first charging circuit and the first plurality of switches are part of the primary control circuit; and establishing the state of the selected ferrite module; when operating in a second mode: selecting a ferrite module to establish the state of; coupling a selected row of the plurality of rows of the ferrite module matrix to a reference potential via a second plurality of switch pairs, wherein the second plurality of switch pairs is part of a redundant control circuit; coupling a selected column of the plurality of columns of the ferrite module matrix to a second charging circuit via a second plurality of switches, wherein the second charging circuit and the second plurality of switches are part of the redundant control circuit; and establishing the state of the selected ferrite module.

Example 8 includes the method of Example 7, further comprising preventing pass back current from interfering with the primary control circuit or the redundant control circuit.

Example 9 includes the method of any of Examples 7-8, wherein establishing the state of the selected ferrite module in the first mode comprises: coupling the selected row of the plurality of rows to a reference potential by driving a pair of switches of the first plurality of switch pairs closed; charging the first charging circuit to a specified charging voltage; and coupling the selected column of the plurality of columns to the first charging circuit by driving a switch of the first plurality of switches closed to discharge the specified charging voltage to a selected latch wire of the selected ferrite module identified by the selected row and the selected column.

Example 10 includes the method of Example 9, further comprising preventing the specified charging voltage from being received by ferrite modules in the matrix other than the selected ferrite module.

Example 11 includes the method of any of Examples 9-10, further comprising driving the pair of switches of the first plurality of switch pairs open after the specified charging voltage is discharged.

Example 12 includes the method of any of Examples 9-11, wherein establishing the state of the selected ferrite module in the first mode further comprises polarizing the selected ferrite module to change a path of communication.

Example 13 includes the method of any of Examples 9-12, further comprising verifying that the specified charging voltage has been discharged from a capacitor of the first charging circuit.

Example 14 includes the method of any of Examples 7-13, wherein establishing the state of the selected ferrite module in the second mode comprises: disabling the primary control circuit; coupling the selected row of the plurality of rows to a reference potential by driving a pair of switches of the second plurality of switch pairs closed; charging the second charging circuit to a specified charging voltage; and coupling the selected column of the plurality of columns to the second charging circuit by driving a switch of the second plurality of switches closed to discharge the specified charging voltage to a selected latch wire of the selected ferrite module identified by the selected row and the selected column.

Example 15 includes a communications module comprising: one or more first radio frequency components; one or more second radio frequency components; and a protection switching circuit including: a first controller; a first charging circuit; a second controller, wherein the second controller is configured to operate as a redundant controller, wherein only one of either the first controller or second controller is used at a given point in time; a second charging circuit; a plurality of ferrite modules arranged in the form of a matrix configured to couple the one or more first radio frequency components with the one or more second radio frequency components; a plurality of first switches, wherein a first subset of the plurality of first switches is controlled by the first controller and couples a plurality of columns of ferrite modules to the first charging circuit, wherein a second subset of the first plurality of switches is controlled by the second controller and couples a plurality of columns of ferrite modules to the second charging circuit; a plurality of second switches, wherein the plurality of second switches are organized into pairs, wherein each pair of switches in the plurality of second switches couples a respective row of the plurality of ferrite modules to a reference potential, wherein a first subset of the plurality of second switches is controlled by the first controller, wherein a second subset of the plurality of second switches is controlled by the second controller; one or more first comparators coupled to the first charging circuit and the first controller, wherein after a specific voltage has been reached by the charging circuit, one of the one or more first comparators signals to the controller, which in turn selects a specific ferrite module to be polarized by driving one of the first subset of first switches and one of the first subset of second switches; and one or more second comparators coupled to the second charging circuit and second controller, wherein after a specific voltage has been reached by the second charging circuit, one of the one or more second comparators signals to the second controller, which in turn selects a specific ferrite module to be polarized by driving one of the second subset of first switches and one pair of switches of the second subset of second switches.

Example 16 includes the system of Example 15, wherein the plurality of first switches are P-channel field-effect transistors.

Example 17 includes the system of any of Examples 15-16, wherein the plurality of second switches are N-channel field-effect transistors.

Example 18 includes the system of any of Examples 15-17, further comprising a plurality of diodes coupled between the plurality of ferrite modules and the plurality of first switches.

Example 19 includes the system of any of Examples 15-18, wherein either the one or more first radio frequency components or the one or more second radio frequency components are low-noise amplifiers.

Example 20 includes the system of any of Examples 15-19, wherein either the one or more first radio frequency components or the one or more second radio frequency components are antennas.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A protection switching circuit comprising:
    a plurality of ferrite modules arranged in a form of a matrix, wherein the matrix includes a plurality of columns and a plurality of rows;
    a primary control module configured to select a specific ferrite module to be polarized by coupling the ferrite module to a first charging circuit;
    a redundant control module configured to select a specific ferrite module to be polarized by coupling the ferrite module to a second charging circuit, wherein the redundant control module is used when the primary control module is not used;
    a plurality of first switches, wherein a first subset of the plurality of first switches is controlled by the primary control module and couples the plurality of columns of ferrite modules to the first charging circuit, wherein a second subset of the first plurality of switches is controlled by the redundant control module and couples the plurality of columns of ferrite modules to the second charging circuit; and
    a plurality of second switches, wherein the plurality of second switches are organized into pairs, wherein each pair of switches in the plurality of second switches couples a respective row of the plurality of ferrite modules to a reference potential, wherein a first subset of the plurality of second switches is controlled by the primary control module, wherein a second subset of the plurality of second switches is controlled by the redundant control module.

2. The circuit of claim 1, further comprising a plurality of diodes coupled between the plurality of ferrite modules and the plurality of first switches.

3. The circuit of claim 1, wherein connections to the ferrite modules are made through latch wires.

4. The circuit of claim 3, wherein the plurality of columns is organized into pairs, wherein the latch wires connected in each row of the pair of columns correspond to an opposite polarity of the same ferrite module.

5. The circuit of claim 3, wherein the plurality of rows is organized into pairs, wherein the latch wires connected in each column of the pair of rows correspond to an opposite polarity of the same ferrite module.

6. The circuit of claim 1, wherein the reference potential is ground.

7. A communications system comprising:
    one or more first radio frequency components;
    one or more second radio frequency components; and
    a protection switching circuit including:
        a first controller;
        a first charging circuit;
        a second controller, wherein the second controller is configured to operate as a redundant controller, wherein only one of either the first controller or second controller is used at a given point in time;
        a second charging circuit;
        a plurality of ferrite modules arranged in a form of a matrix configured to couple the one or more first radio frequency components with the one or more second radio frequency components;
        a plurality of first switches, wherein a first subset of the plurality of first switches is controlled by the first controller and couples a plurality of columns of ferrite modules to the first charging circuit, wherein a second subset of the first plurality of switches is controlled by the second controller and couples a plurality of columns of ferrite modules to the second charging circuit;

a plurality of second switches, wherein the plurality of second switches are organized into pairs, wherein each pair of switches in the plurality of second switches couples a respective row of the plurality of ferrite modules to a reference potential, wherein a first subset of the plurality of second switches is controlled by the first controller, wherein a second subset of the plurality of second switches is controlled by the second controller;

one or more first comparators coupled to the first charging circuit and the first controller, wherein after a specific first voltage has been reached by the first charging circuit, one of the one or more first comparators signals to the controller, which in turn selects a first ferrite module to be polarized by driving one of the first subset of first switches and one of the first subset of second switches; and one or more second comparators coupled to the second charging circuit and second controller, wherein after a second voltage has been reached by the second charging circuit, one of the one or more second comparators signals to the second controller, which in turn selects the first ferrite module or a second ferrite module to be polarized by driving one of the second subset of first switches and one pair of switches of the second subset of second switches.

8. The system of claim 7, wherein the plurality of first switches are P-channel field-effect transistors.

9. The system of claim 7, wherein the plurality of second switches are N-channel field-effect transistors.

10. The system of claim 7, further comprising a plurality of diodes coupled between the plurality of ferrite modules and the plurality of first switches.

11. The system of claim 7, wherein either the one or more first radio frequency components or the one or more second radio frequency components are low-noise amplifiers.

12. The system of claim 7, wherein either the one or more first radio frequency components or the one or more second radio frequency components are antennas.

* * * * *